United States Patent
Kim et al.

(10) Patent No.: US 9,641,149 B2
(45) Date of Patent: May 2, 2017

(54) MATCHING SEGMENT CIRCUIT TO WHICH RADIO FREQUENCY IS APPLIED AND RADIO FREQUENCY INTEGRATED DEVICES USING THE MATCHING SEGMENT CIRCUIT

(71) Applicant: Samsung Electronics Co., Ltd., Suwon-si (KR)

(72) Inventors: Duck Hwan Kim, Goyang-si (KR); In Sang Song, Osan-si (KR); Chul Soo Kim, Hwaseong-si (KR); Young Il Kim, Suwon-si (KR); Jea Shik Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 153 days.

(21) Appl. No.: 14/605,044

(22) Filed: Jan. 26, 2015

(65) Prior Publication Data
US 2015/0137906 A1 May 21, 2015

Related U.S. Application Data

(62) Division of application No. 13/198,163, filed on Aug. 4, 2011, now abandoned.

(30) Foreign Application Priority Data

Nov. 9, 2010 (KR) .................. 10-2010-0111045

(51) Int. Cl.
*H03H 7/38* (2006.01)
*H03H 9/54* (2006.01)

(52) U.S. Cl.
CPC ............ *H03H 7/38* (2013.01); *H03H 9/54* (2013.01); *H03H 2007/386* (2013.01)

(58) Field of Classification Search
CPC ..... H03H 7/38; H03H 11/28; H03H 2007/386
(Continued)

(56) References Cited

U.S. PATENT DOCUMENTS

| 4,706,048 A | 11/1987 | Atalar |
| 6,621,370 B1 * | 9/2003 | Dao ............... H03H 7/422 333/136 |

(Continued)

FOREIGN PATENT DOCUMENTS

| JP | 2000-36721 A | 2/2000 |
| JP | 2001-313542 A | 11/2001 |

(Continued)

OTHER PUBLICATIONS

Korean Office Action issued on Mar. 8, 2016 in counterpart Korean Application No. 2010-0111045 (5 pages in English; 6 pages in Korean).

*Primary Examiner* — Stephen E Jones
(74) *Attorney, Agent, or Firm* — NSIP Law

(57) ABSTRACT

Provided are a matching segment circuit, to which a radio frequency (RF) is applied, and an RF integrated device using the matching segment circuit. The matching segment circuit to which an RF is applied may include an input end connected to a first RF device, a parallel segment having a first capacitor and a first inductor connected in parallel, a second inductor connected to the parallel segment in series, and an output end connected to a second RF device. The first capacitor, the first inductor, and the second inductor may be configured so that an impedance of the first RF device and an impedance of the second RF device may match.

17 Claims, 20 Drawing Sheets

(58) Field of Classification Search
USPC .... 333/124, 125, 100, 132, 32, 33, 133, 193
See application file for complete search history.

(56) References Cited

U.S. PATENT DOCUMENTS

| | | |
|---|---|---|
| 6,741,145 B2 | 5/2004 | Tikka et al. |
| 7,917,096 B2 * | 3/2011 | Wilcox ................ H04B 1/0458 333/124 |
| 8,421,554 B2 | 4/2013 | Kenington |
| 2010/0090917 A1 * | 4/2010 | Roeckl .................... H04B 1/18 343/722 |

FOREIGN PATENT DOCUMENTS

| | | |
|---|---|---|
| JP | 2006-129445 A | 5/2006 |
| KR | 2001-0031580 A | 4/2001 |
| KR | 2003-0067901 A | 8/2003 |
| KR | 10-0677495 B1 | 2/2007 |
| KR | 10-0691134 B1 | 3/2007 |
| WO | WO 2008/033762 A2 | 3/2008 |
| WO | WO 2009/036080 A1 | 3/2009 |

* cited by examiner

MATCHING SEGMENT CIRCUIT TO WHICH RADIO FREQUENCY IS APPLIED AND RADIO FREQUENCY INTEGRATED DEVICES USING THE MATCHING SEGMENT CIRCUIT

CROSS-REFERENCE TO RELATED APPLICATIONS

This application is a division of application Ser. No. 13/198,163 filed on Aug. 4, 2011, which claims the benefit of Korean Application No. 10-2010-0111045 filed on Nov. 9, 2010, in the Korean Intellectual Property Office, the entire disclosures of which are incorporated herein by reference for all purposes.

BACKGROUND

1. Field

The following description relates to a matching circuit for reducing reflections due to an impedance difference between an input end and an output end, and a radio frequency (RF) integrated device using the matching circuit.

2. Description of Related Art

In situations in which different radio frequency (RF) devices are connected to an input end and an output end of a duplexer or a multiplexer to which an RF is applied, a signal or power may be reflected due to an impedance difference between the two different connection ends. As a result, transmission efficiency may be decreased. In general, the impedance difference between two different connection ends may be compensated for by a matching circuit. For example, the impedance difference between two different connection ends in a conventional bulk acoustic wave resonator (BAWR) duplexer has been compensated for by using a ¼ wave length transmission line.

SUMMARY

In one general aspect, there is provided a matching segment circuit to which a radio frequency (RF) is applied, the circuit including an input end connected to a first RF device, a parallel segment having a first capacitor and a first inductor connected in parallel, a second inductor connected to the parallel segment in series, and an output end connected to a second RF device, wherein the first capacitor, the first inductor, and the second inductor are configured so that an impedance of the first RF device and an impedance of the second RF device match.

In another general aspect, there is provided a matching segment circuit to which an RF is applied, the circuit including an input end connected to a first RF device, a parallel segment having a first capacitor and a first inductor connected in parallel, a second capacitor connected to the parallel segment in series, and an output end connected to a second RF device, wherein the first capacitor, the first inductor, and the second capacitor are configured so that an impedance of the first RF device and an impedance of the second RF device match.

In another general aspect, there is provided a matching segment circuit to which an RF is applied, the circuit including a first matching unit, and a second matching unit, wherein the first matching unit includes a first input end, a first parallel segment, connected to the first input end, having a first capacitor and a first inductor connected in parallel, a second inductor connected to the first parallel segment in series, and a first output end connected to the second inductor, and the second matching unit includes a second input end, a second parallel segment, connected to the second input end, having a second capacitor and a third inductor connected in parallel, a third capacitor connected to the second parallel segment in series, and a second output end connected to the third capacitor, and the first, second, and third capacitor and first, second, and third inductor are configured so that an impedance of at least one RF device connected to an input of the matching segment circuit matches an impedance of at least one RF device connected to an output of the matching segment circuit.

The first output end of the first matching unit and the second input end of the second matching unit may be connected to each other in series.

The first input end of the first matching unit and the second input end of the second matching unit may be connected to each other in parallel to a first RF device.

The first input end of the first matching unit may be connected to a first RF device, and the second input end of the second matching unit may be connected to a second RF device.

The first output end of the first matching unit and the second output end of the second matching unit may be connected to each other in parallel to a third RF device.

The first output end of the first matching unit is connected to a third RF device, and the second output end of the second matching unit is connected to a fourth RF device.

In another general aspect, there is provided an RF integrated device using a matching segment circuit, the device including a first matching unit, and a first integrated device, connected to the first matching unit, using a bulk acoustic wave resonator (BAWR) including a second input end and a second output end, wherein the first matching unit includes a first input end, a parallel segment, connected to the first input end, having a first capacitor and a first inductor connected to each other in parallel, a second inductor connected to the parallel segment in series, and a first output end connected to the second inductor, wherein the first capacitor, the first inductor, and the second inductor are configured so that an impedance of the first integrated device matches an impedance of at least one external RF device connected to the first matching unit.

The first integrated device may be a band-pass filter, the second output end and the second input end may be respectively configured as a single port, and the second output end may be connected to the first input end.

The first integrated device may be a band-pass filter, the second output end and the second input end may be respectively configured as a single port, and the second input end may be connected to the first output end.

The device may further include a second integrated device, connected to the first matching unit, using a BAWR including a third output end and a third input end respectively configured as a single port, and an antenna end to transmit and receive a signal.

The first integrated device may be a receiving filter, the second output end and the second input end may be respectively configured as a single port, the second integrated device may be a transmitting filter, and the second input end may be connected to the first output end, and the third input end and the first input end may be connected to the antenna end.

In another general aspect, there is provided an RF integrated device using a matching segment circuit, the device including a first matching unit, a second matching unit; and a first integrated device, connected to the first and second matching unit, using a bulk acoustic wave resonator (BAWR) including a third input end and a third output end, wherein the first matching unit includes, a first input end, a first parallel segment, connected to the first input end, having a first capacitor and a first inductor connected in parallel, a second inductor connected to the first parallel segment in series, and a first output end connected to the second inductor, and the second matching unit includes a second input end, a second parallel segment, connected to the second input end, having a second capacitor and a third inductor connected in parallel, a third capacitor connected to the second parallel segment in series, and a second output end connected to the third capacitor, and the first, second, and third capacitor and first, second, and third inductor are configured so that an impedance of the first integrated device matches an impedance of at least one external RF device connected to the first and/or second matching unit.

The first integrated device may be a band-pass filter including the third output end and the third input end respectively configured as a single port, and the first and second input ends may be connected to the third output end.

The first integrated device may be a balance filter including the third output end and the third input end respectively configured as a dual port, and the first input end and the second input end may be connected to the third output end.

The first integrated device is a band-pass filter including the third output end and the third input end respectively configured as a single port, and the first and second output ends are connected to the third input end.

The first integrated device may be a band-pass filter including the third output end and the third input end respectively as a dual port, the first and second input ends may be connected to the one external RF device, and the first and second output ends may be connected to the third input end.

The first output end of the first matching unit may be connected to a first external RF device, and the second output end of the second matching unit may be connected to a second external RF device.

The first input end of the first matching unit may be connected to a first external RF device, and the second input end of the second matching unit may be connected to a second external RF device.

The device may further include a second integrated device, connected to the first and/or second matching unit, using a BAWR including a fourth output end and a fourth input end respectively configured as a single port, and an antenna end to transmit and receive a signal.

The first integrated device may be a receiving filter, the third output end and the third input end respectively configured as a dual port, the second integrated device may be a transmitting filter, the third input end may be connected to the first output end and the second output end, and the fourth input end, the first input end, and the second input end may be connected to the antenna end.

In another general aspect, there is provided a matching segment circuit to match impedances between connected RF devices, the circuit including an input end configured to be connected to at least one RF device, an output end configured to be connected to at least one other RF device, a first passive electrical component connected between the input end and a reference potential, a second passive electrical component connected between the input end and the output end, wherein the first and second passive electrical components are configured to match the impedances between the connected RF devices.

The circuit may further include a third passive electrical component connected between the output end and the reference potential.

The first and second passive electrical components may be capacitors, inductors, or a combination thereof.

By using a matching segment circuit to which an RF is applied, the size of the circuit may be reduced, and an impedance of an input end and an impedance of an output end different from the input end may be effectively matched.

By using a duplexer including a matching segment circuit to which an RF is applied, a function of the duplexer may be enhanced.

By using a small sized RF integrated device, an RF wireless communication device may be further reduced in size.

By using a matching segment circuit to which an RF is applied, an impedance may be effectively matched, thereby reducing a power loss.

Other features and aspects may be apparent from the following detailed description, the drawings, and the claims.

Figure 1A:
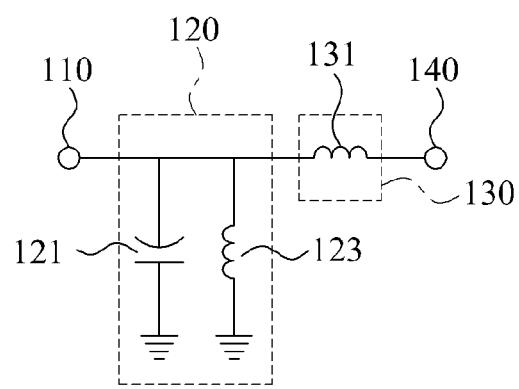
FIGS. 1A and 1B are diagrams illustrating examples of a matching segment circuit to which a radio frequency (RF) is applied.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, description of well-known functions and constructions may be omitted for increased clarity and conciseness.

A matching segment circuit to which a radio frequency (RF) is applied and an RF integrated device according to various examples may be included in a mobile device to be utilized in a wireless mobile communication service field. In more detail, the matching segment circuit to which an RF is applied and the RF integrated device may be used as a matching unit for reducing reflections due to an impedance difference between an output end and an input end of a device such as, for example, an RF duplexer or an RF multiplexer.

The matching segment circuit to which an RF is applied and the RF integrated device may be used as an external connection unit or a component of an existing bulk acoustic wave resonator (BAWR) duplexer for which a matching operation may be employed for an improved phase characteristic.

A BAWR may operate through electrodes placed at the top and the bottom of a piezoelectric layer. In a configuration in which an RF potential is applied to a top electrode and a bottom electrode, the piezoelectric layer may vibrate, enabling the BAWR to operate as a filter.

The BAWR may correspond to a device for inducing a wave or a vibration of a predetermined frequency using a resonance phenomenon, and may be used as a component of an RF device such as, for example, a filter and an oscillator.

Throughout the descriptions of the various examples that follow, the term connection may refer to an electrical connection through which a signal is transferred. However, it is not necessary that a physical connection, e.g., wired connection, exists between the two discussed components. For example, two components may respectively transmit and receive a signal in a wireless fashion, yet may still be referred to as being connected.

Figure 1B:
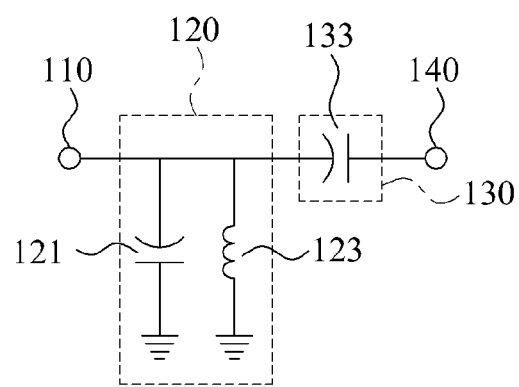

FIGS. 1A and 1B illustrate an example of a matching segment circuit to which an RF is applied.

Referring to FIGS. 1A and 1B, an example of a matching segment circuit to which an RF is applied may include an input end 110, a parallel segment 120, a series segment 130, and an output end 140. The parallel segment 120 and series segment 130 may include passive electrical components. In the various examples discussed herein, these passive electrical components are represented by capacitors and/or inductors. A second inductor 131 may correspond to a component of the series segment 130 in FIG. 1A, and a second capacitor 133 may correspond to a component of the series segment 130 in FIG. 1B. The matching segment circuit to which an RF is applied may correspond to a circuit including a plurality of matching components for matching an impedance difference between the input end 110 and the output end 140.

The input end 110 may be configured as a single input port and may be connected to an external first RF device. The term connected as used in this description may not necessarily imply a physical connection, but rather an electrical connection through which a current, signal, etc., is passed. The input end 110 may receive an input of a signal from the first RF device. The parallel segment 120 may have a configuration in which a first capacitor 121 and a first inductor 123 are connected to each other in parallel. The series segment 130 may be connected to the parallel segment 120 in series between the input end 110 and the output end 140, and may include the second inductor 131. In another example, as illustrated in FIG. 1B, the series segment 130 may include the second capacitor 133. One or more components of the parallel segment 120 and the series segment 130 may be determined so that an impedance of the first RF device and an impedance of the second RF device may match. The output end 140 may be configured by a single output port to be connected to an external second RF device. The output end 140 may transfer, to the second RF device, a signal matched through the parallel segment 120 and the series segment 130.

An example configuration of the matching segment circuit to which an RF is applied may be described as follows. In FIG. 1A, one end of the first capacitor 121 may be connected to the input end 110, and another end of the first capacitor 121 may be connected to a reference potential. For the purpose of the examples discussed herein, the other end of the first capacitor 121 will be grounded, but the examples are not limited thereto. One end of the first inductor 123 may be connected to the input end 110, and another end of the first inductor 123 may be connected to the reference potential, e.g., grounded. One end of the second inductor 131 may be connected to the parallel segment 120, and another end of the second inductor 131 may be connected to the output end 140. In FIG. 1B, as in FIG. 1A, one end of the first capacitor 121 may be connected to the input end 110, and another end of the first capacitor 121 may be grounded. Also, as previously discussed in regard to FIG. 1A, in FIG. 1B one end of the first inductor 123 may be connected to the input end 110, and another end of the first inductor 123 may be grounded. However, in contrast to the configuration of FIG. 1A, in FIG. 1B one end of the second capacitor 133 may be connected to the parallel segment 120, and another end of the second capacitor 133 may be connected to the output end 140.

FIG. 2A through FIG. 4B illustrate other examples of a matching segment circuit to which an RF is applied.

Figure 2A:
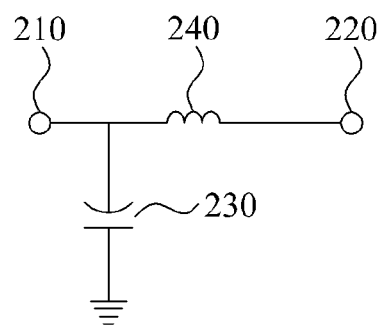
FIGS. 2A, 2B, 2C, 3A, 3B, 4A, and 4B are diagrams illustrating other examples of a matching segment circuit to which an RF is applied.
Figure 2B:
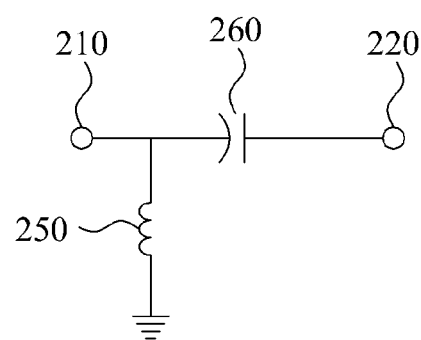
Figure 2C:
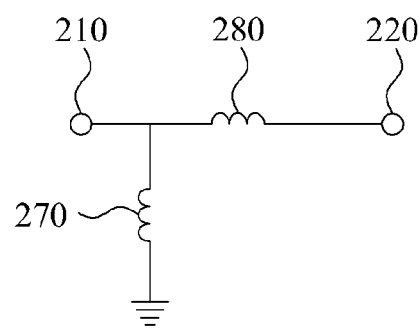

Referring to FIGS. 2A, 2B, and 2C, a matching segment circuit to which an RF is applied according to an example illustrated in FIG. 2A may include a substantially L-shaped circuit configured by an input end 210, a capacitor 230, an inductor 240, and an output end 220. While referred to as an L-shaped circuit in this and various other examples, and other various examples discussed later are referred to as having various shapes such as π or T, it is understood that the circuit examples discussed herein are not limited to such shapes. Values of the capacitor 230 and the inductor 240 may be determined so that an impedance of a first RF device connected to the input end 210 and an impedance of a second RF device connected to the output end 220 may match.

A matching segment circuit to which an RF is applied according to an example illustrated in FIG. 2B may include an L-shaped circuit configured by an input end 210, a capacitor 260, an inductor 250, and an output end 220. Values of the capacitor 260 and the inductor 250 may be determined so that an impedance of a first RF device connected to the input end 210 and an impedance of a second RF device connected to the output end 220 may match.

A matching segment circuit to which an RF is applied according to an example illustrated in FIG. 2C may include an L-shaped circuit configured by an input end 210, a first inductor 270, a second inductor 280, and an output end 220. Values of the first inductor 270 and the second inductor 280 may be determined so that an impedance of a first RF device connected to the input end 210 and an impedance of a second RF device connected to the output end 220 may match.

Figure 3A:
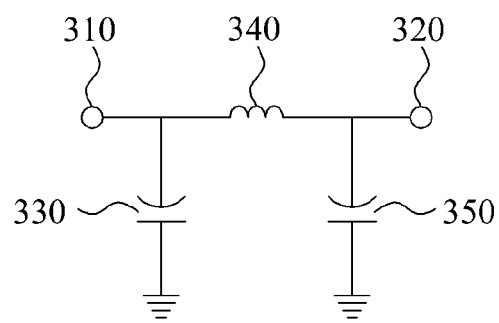
Figure 3B:
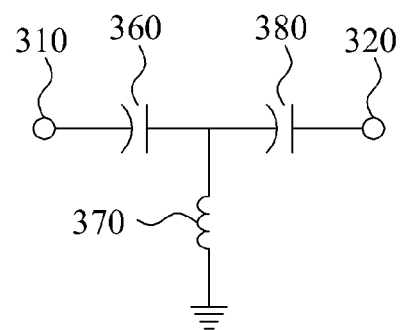

Referring to FIGS. 3A and 3B, a matching segment circuit to which an RF is applied according to an example illustrated in FIG. 3A may include a substantially i-shaped circuit configured by an input end 310, a first inductor 340, a first capacitor 330, a second capacitor 350, and an output end 320. Values of the first inductor 340, the first capacitor 330, and second capacitor 350 may be determined so that an impedance of a first RF device connected to the input end 310 and an impedance of a second RF device connected to the output end 320 may match.

A matching segment circuit to which an RF is applied according to an example illustrated in FIG. 3B may include a substantially T-shaped circuit configured by an input end 310, a first capacitor 360, a first inductor 370, a second capacitor 380, and an output end 320. Values of the first capacitor 360, the first inductor 370, and the second capacitor 380 may be determined so that an impedance of a first RF device connected to the input end 310 and an impedance of a second RF device connected to the output end 320 may match.

Figure 4A:
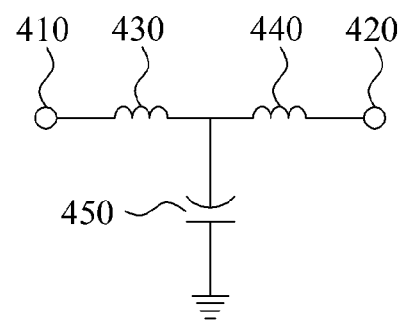
Figure 4B:
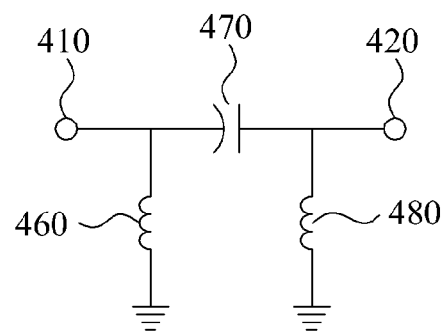

Referring to FIGS. 4A and 4B, a matching segment circuit to which an RF is applied according to an example illustrated in FIG. 4A may include a substantially T-shaped circuit configured by an input end 410, a first inductor 430, a second inductor 440, a first capacitor 450, and an output end 420. Values of the first inductor 430, the second inductor 440, and the first capacitor 450 may be determined so that an impedance of a first RF device connected to the input end 410 and an impedance of a second RF device connected to the output end 420 may match.

A matching segment circuit to which an RF is applied according to an example illustrated in FIG. 4B may include a substantially i-shaped circuit configured by an input end 410, a first inductor 460, a second inductor 480, a first capacitor 470, and an output end 420. Values of the first inductor 460, the second inductor 480, and the first capacitor 470 may be determined so that an impedance of a first RF device connected to the input end 410 and an impedance of a second RF device connected to the output end 420 may match.

Figure 5A:
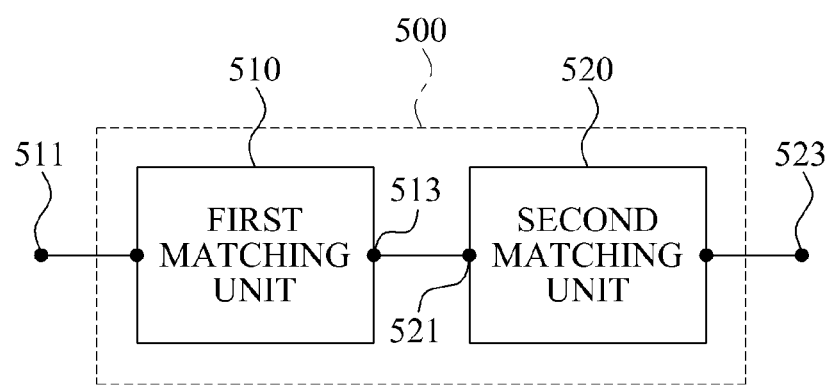
FIGS. 5A, 5B, and 5C are diagrams further illustrating examples of a matching segment circuit to which an RF is applied.
Figure 5B:
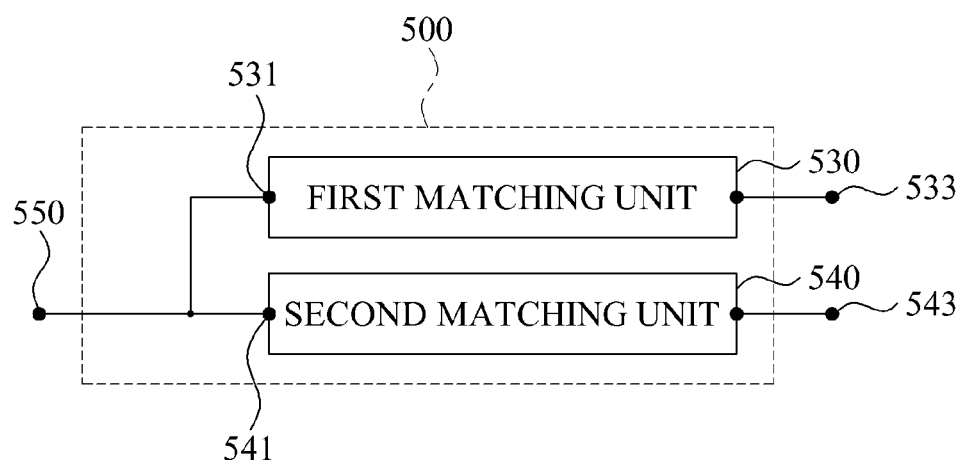
Figure 5C:
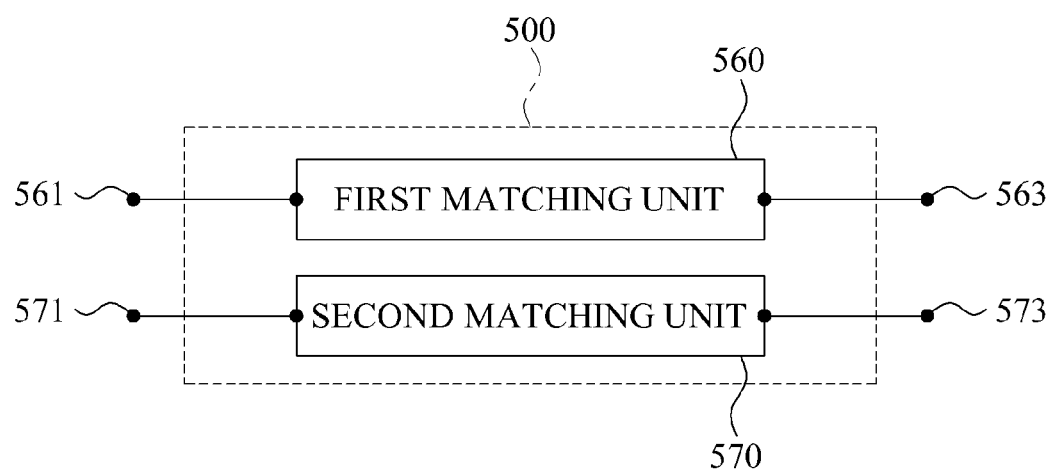

FIGS. 5A, 5B, and 5C illustrate still other examples of a matching segment circuit 500 to which an RF is applied.

Referring to FIGS. 5A, 5B, and 5C, the matching segment circuit 500 to which an RF may be applied may be provided in a configuration in which any of the example matching segment circuits illustrated in FIG. 1A through FIG. 4B, to which an RF is applied, may be connected in various forms. FIG. 5A illustrates a single ended type matching segment circuit to which an RF is applied having an input end of a single port configuration and an output end also of a single port configuration. FIG. 5B illustrates a balun type matching segment circuit to which an RF is applied having an input end of a single port configuration and an output end of a dual port configuration. FIG. 5C illustrates a balance type matching segment circuit to which an RF is applied having an input end of a dual port configuration and an output end of a dual port configuration. Referring to FIGS. 5A, 5B, and 5C, any of the example matching segment circuits to which an RF is applied in FIG. 1A through FIG. 4B may be provided as a first matching unit and a second matching unit.

Referring to FIG. 5A, the matching segment circuit 500 to which an RF is applied may include a first input end 511, a first matching unit 510, a first output end 513, a second input end 521, a second matching unit 520, and a second output end 523. In this example, any of the example matching segment circuits to which an RF is applied in FIG. 1A through FIG. 4B may be provided as the first matching unit 510 and the second matching unit 520.

For example, regarding the matching segment circuit 500 of FIG. 5A, the matching segment circuit to which an RF is applied in FIG. 1A may be provided as the first matching unit 510, and the matching segment circuit to which an RF is applied in FIG. 1B may be provided as the second matching unit 520. In this example, the first matching unit 510 may include the first input end 511, a first parallel segment, a second inductor, and the first output end 513, and the second matching unit 520 may include the second input end 521, a second parallel segment, a third capacitor, and the second output end 523.

The first parallel segment may have a configuration in which a first capacitor and a first inductor are connected to each other in parallel, and the second inductor may be connected to the first parallel segment in series between the first input end 511 and the first output end 513. The second parallel segment may have a configuration in which a second capacitor and a third inductor are connected to each other in parallel, and the third capacitor may be connected to the second parallel segment in series between the second input end 521 and the second output end 523.

The first input end 511 may correspond to an input end of the overall matching segment circuit 500 to which an RF is applied, and the second output end 523 may correspond to an output end of the overall matching segment circuit 500 to which an RF is applied.

The first input end 511 may be connected to an external first RF device. The second output end 523 may be connected to a second RF device. Since the first output end 513 may be connected to the second input end 521 in series, the second RF device may correspond to the second matching unit 520. The second input end 521 may be connected to a third RF device. Since the second input end 521 may be connected to the first output end 513, the third RF device may correspond to the first matching unit 510. In such an example configuration, the second output end 523 may be connected to a fourth RF device.

In this instance, the first capacitor, the first inductor, the second inductor, the second capacitor, the third inductor, and the third capacitor may be determined so that an impedance of the first RF device connected to the first input end 511 and an impedance of the fourth RF device connected to the second output end 523 may match.

As another example, the matching segment circuit to which an RF is applied in FIG. 1B may be provided as the first matching unit 510, and the matching segment circuit to which an RF is applied in FIG. 1A may be provided as the second matching unit 520.

Referring to FIG. 5B, the matching segment circuit to which an RF is applied 500 may include an input end 550, a first matching unit 530, a second matching unit 540, and output ends 533 and 543. For convenience of description, the output ends 533 and 543 may be referred to as a first output end 533 and a second output end 543, and the input end 550 may be referred to as a third input end 550. Any of the various example matching segment circuits to which an RF is applied in FIG. 1A through FIG. 4B may be provided as the first matching unit 530 and the second matching unit 540.

For example, the matching segment circuit to which an RF is applied in FIG. 1A may be provided as the first matching unit 530, and the matching segment circuit to which an RF is applied in FIG. 1B may be provided as the second matching unit 540. In this case, the first matching unit 530 may include a first input end 531, a first parallel segment, a second inductor, and a first output end 533, and the second matching unit 540 may include a second input end 541, a second parallel segment, a third capacitor, and a second output end 543. The first input end 531 and the second input end 541 may be connected to the third input end 550. A signal inputted through a single port may be outputted to a dual port through the first matching unit 530 and the second matching unit 540. The first output end 533 and the second output end 543 may correspond to output ends configured by a dual port of the matching segment circuit 500 to which an RF is applied.

A first RF device may be connected to the first input end 531 of the first matching unit 530, and a third RF device may be connected to the second input end 541 of the second matching unit 540. The first and third RF devices may be similar or identical to a fifth RF device connected to the third input end 550. In another example, the same signal may be inputted from a single RF device. A second RF device may be connected to the first output end 533 of the first matching unit 530, and may be similar or identical to a fourth RF device that may be connected to the second output end 543 of the second matching unit 540. The matching segment circuit 500 to which an RF is applied may have a balun type configuration in which a single signal is inputted and two signals are outputted.

In this instance, the first capacitor, the first inductor, the second inductor, the second capacitor, the third inductor, and the third capacitor may be determined so that an impedance of the fifth RF device connected to the third input end 550 and an impedance of the fourth RF device connected to the second output end 543 may match.

As another example, the matching segment circuit to which an RF is applied in FIG. 1B may be provided as the first matching unit 530, and the matching segment circuit to which an RF is applied in FIG. 1A may be provided as the second matching unit 540.

Referring to FIG. 5C, the matching segment circuit to which an RF is applied 500 may include input ends 561 and 571, a first matching unit 560, a second matching unit 570, and output ends 563 and 573. For a more convenient description, the input ends 561 and 571 may be referred to as a first input end 561 and a second input end 571, and the output ends 563 and 573 may be referred to as a first output end 563 and a second output end 573 henceforth. Any of the example matching segment circuits to which an RF is applied in FIG. 1A through FIG. 4B may be provided as the first matching unit 560 and the second matching unit 570.

For example, the matching segment circuit to which an RF is applied in FIG. 1A may be provided as the first matching unit 560, and the matching segment circuit to which an RF is applied of FIG. 1B may be provided as the second matching unit 570. In this case, the first matching unit 560 may include a first input end 561, a first parallel segment, a second inductor, and a first output end 563, and the second matching unit 570 may include a second input end 571, a second parallel segment, a third capacitor, and a second output end 573.

The first input end 561 and the second input end 571 may correspond to the input ends configured by a dual port of the matching segment circuit 500 to which an RF is applied, and the first output end 563 and the second output end 573 may correspond to the output ends configured by a dual port of the matching segment circuit 500 to which an RF is applied.

A first RF device may be connected to the first input end 561 of the first matching unit 560, and may be similar or identical to a third RF device that may be connected to the second input end 571 of the second matching unit 570. A second RF device may be connected to the first output end 563 of the first matching unit 560, and may be similar or identical to a fourth RF device that may be connected to the second output end 573 of the second matching unit 570. The matching segment circuit 500 to which an RF is applied may have a balance type configuration in which two signals are inputted and two signals are outputted.

In this instance, the first capacitor, the first inductor, the second inductor, the second capacitor, the third inductor, and the third capacitor may be determined so that an impedance of the first and third RF devices respectively connected to the first input end 561 and the second input end 571 and an impedance of the second and fourth RF devices respectively connected to the first output end 563 and the second output end 573 may match.

As another example, the matching segment circuit to which an RF is applied in FIG. 1B may be provided as the first matching unit 560, and the matching segment circuit to which an RF is applied in FIG. 1A may be provided as the second matching unit 570.

FIG. 6A through FIG. 8B illustrate examples of an RF integrated device.

Figure 6A:
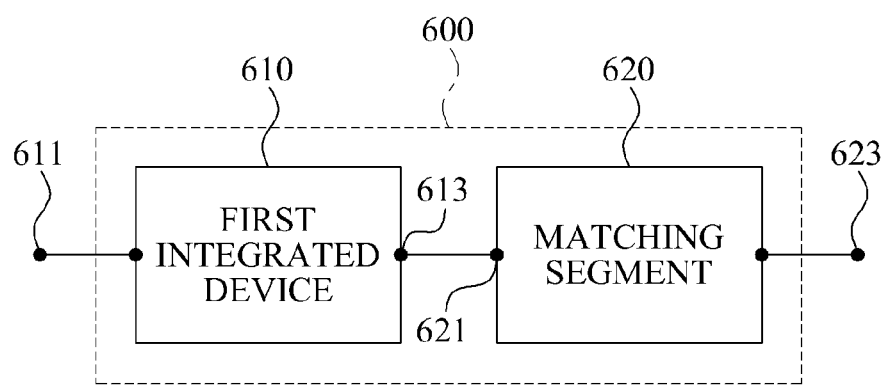
FIGS. 6A, 6B, 6C, 6D, 7A, 7B, 8A, and 8B are diagrams illustrating examples of an RF integrated device.
Figure 6B:
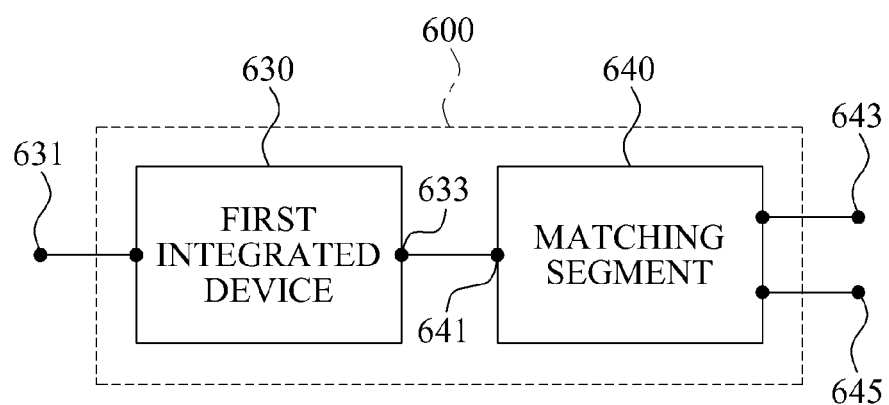
Figure 6C:
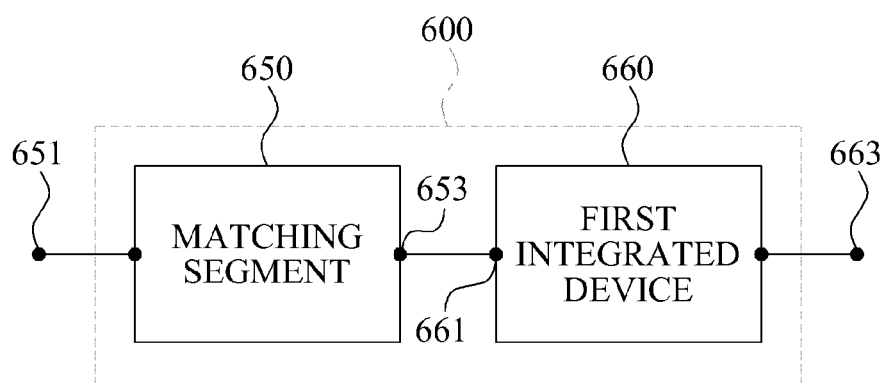
Figure 6D:
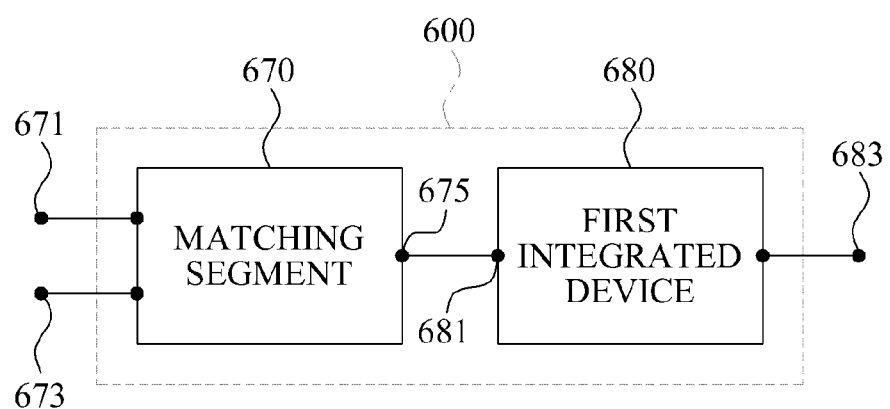
Figure 7A:
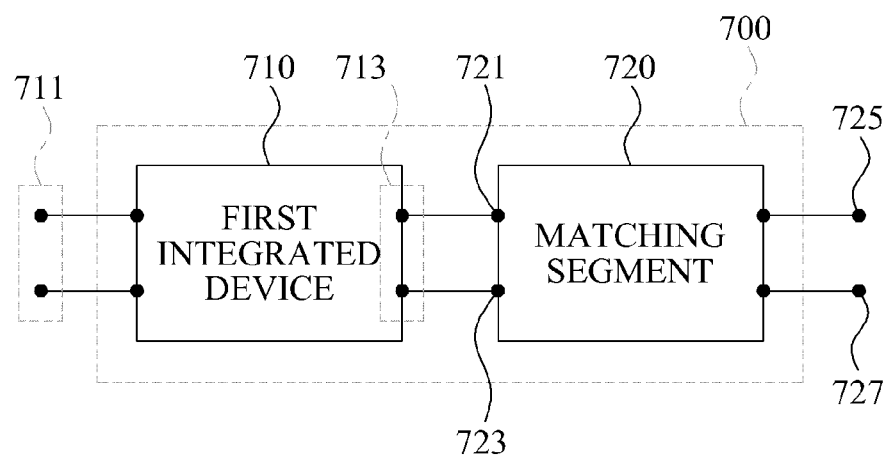
Figure 7B:
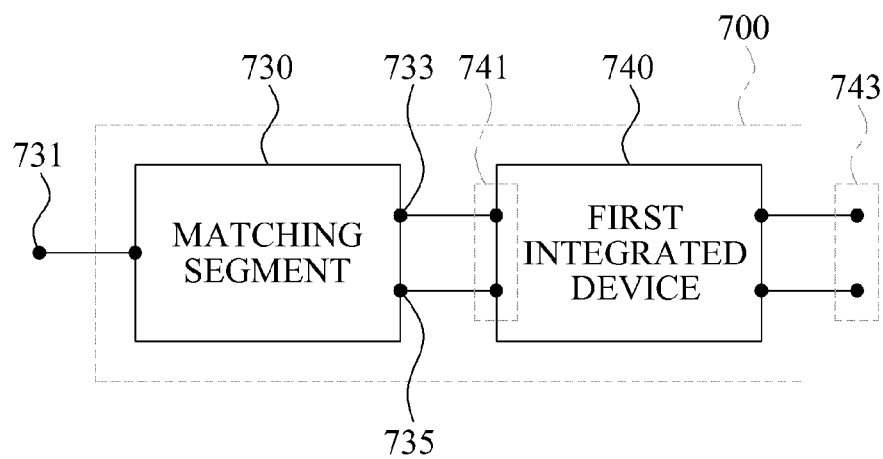

FIGS. 6A through 7B illustrate examples in which the RF integrated device corresponds to an RF filter using a BAWR. In more detail, FIGS. 6A, 6B, 6C, and 6D illustrate a filter having an output end and an input end configured by a single port, and FIGS. 7A and 7B illustrate a filter having an output end and an input end configured by a dual port.

Referring to FIGS. 6A, 6B, 6C, and 6D, the RF integrated device 600 may include a first integrated device and a matching segment. In these examples, any of the various example matching segment circuits to which an RF is applied in FIG. 1A through FIG. 5C may be used as the matching segment. FIG. 6A illustrates an example using a single ended type matching segment having an output end and an input end configured by a single port. FIG. 6B illustrates an example using a balun type matching segment having an input end configured by a single port and an output end configured by a dual port. FIG. 6C illustrates an example in which an input end and an output end are configured in a fashion opposite to the example illustrated in FIG. 6A. Further, FIG. 6D illustrates an example in which an input end and an output end are configured in a fashion opposite to the example illustrated in FIG. 6B.

Referring to FIG. 6A, the RF integrated device 600 may include a first integrated device 610 and a matching segment 620.

The first integrated device 610 may include a second input end 611 configured as a single port, and a second output end 613. In this example, the first integrated device 610 may correspond to, for example, a high pass filter (HPF), a low pass filter (LPF), and a band pass filter (BPF) using a BAWR. The RF integrated device 600 may correspond to a HPF, LPF, and BPF using a BAWR including the matching segment 620.

Any of the various example matching segment circuits to which an RF is applied in FIG. 1A through FIG. 5C may be used as the matching segment 620. For example, the matching segment circuit to which an RF is applied in FIG. 1A may be used as a component of the matching segment 620. Thus, in such an example, the matching segment 620 may include a first input end 621, a parallel segment, a second inductor, and a first output end 623. The second output end 613 of the RF integrated device 600 and the first input end 621 of the matching segment 620 may be connected to each other in series.

In this example, a first capacitor and a first inductor provided in the parallel segment, and the second inductor connected to the parallel segment in series, may be determined so that an impedance of the first integrated device 610 and an impedance of a second RF device connected to the first output end 623 may match.

Referring to FIG. 6B, the RF integrated device 600 may include a first integrated device 630 and a matching segment 640.

The first integrated device 630 may include a third input end 631 configured as a single port and a third output end 633 configured as a single port.

Any of the example matching segment circuits to which an RF is applied in FIG. 1A through FIG. 5C may be used as the matching segment 640. For example, the matching segment circuit to which an RF is applied in FIG. 5B may be used as a component of the matching segment 640. Thus, the matching segment 640 may include a first matching unit and a second matching unit. In an example in which it is assumed that the matching segment circuit to which an RF is applied in FIG. 1A is provided as the first matching unit, and the matching segment circuit to which an RF is applied in FIG. 1B is provided as the second matching unit, the first matching unit may include a first input unit, a first parallel segment, a second inductor, and a first output end 643, and the second matching unit may include a second input unit, a second parallel segment, a third capacitor, and a second output end 645. The first input end and the second input end may be connected to a fourth input end 641 of the matching segment 640. The third output end 633 and the fourth input end 641 may be connected to each other in series. The RF integrated device 600 may receive a single signal to filter the inputted signal, in a predetermined frequency band, and output two signals.

Referring to FIG. 6C, the RF integrated device 600 may include a matching segment 650 and a first integrated device 660. The matching segment 650 may include a first input end 651 and a first output end 653, and the first integrated device 660 may include a second input end 661 configured as a single port and a second output end 663 configured as a single port. The first output end 653 may be connected to the second input end 661 in series. FIG. 6C illustrates an example in which locations of the matching segment and the first integrated device of FIG. 6A are changed, and further descriptions thereof will be omitted as they follow from that previously described example.

Referring to FIG. 6D, the RF integrated device 600 may include a matching segment 670 and a first integrated device 680. The matching segment 670 may include a first input end 671, a second input end 673, and a first output end 675, and the first integrated device 680 may include a third input end 681 configured as a single port and a second output end 683 configured as a single port. The first output end 675 may be connected to the third input end 681 in series. FIG. 6D illustrates an example in which locations of the matching segment and the first integrated device of FIG. 6B are changed, and further descriptions will be omitted as they follow from that previously described example Referring to FIG. 7A and FIG. 7B, an RF integrated device 700 may include a first integrated device and a matching segment. Any of the various example matching segment circuits to which an RF is applied in FIG. 1A through FIG. 5C may be provided as the matching segment. FIG. 7A illustrates an example using a balance type matching segment having an output end and an input end which are both configured as a dual port. FIG. 7B illustrates an example using a balun type matching segment having an input end of a single port configuration and an output end of a dual port configuration.

Referring to FIG. 7A, the RF integrated device 700 may include a first integrated device 710 and a matching segment 720.

The first integrated device 710 may include a third output end 713 and a third input end 711 respectively configured as a dual port. In this instance, the first integrated device 710 may correspond to, for example, a HPF, a LPF, and a BPF using a BAWR. The first integrated device 710 may correspond to a balance filter. The balance filter may correspond to a filter for receiving a balance signal, and transmitting a signal of a predetermined frequency band. The balance signal may correspond to a signal including a received signal and a signal having a phase value opposite to that of the received signal. The balance signal may be used for minimizing noise of the received signal. The RF integrated device 700 may correspond to, for example, a HPF, a LPF, and a BPF using a BAWR including the matching segment 720.

Any of the various example matching segment circuits to which an RF is applied in FIG. 1A through FIG. 5C may be used as the matching segment 720. For example, the matching segment circuit of FIG. 5C to which an RF is applied may be used as a component of the matching segment 720. Thus, the matching segment 720 may include a first matching unit and a second matching unit. In an example in which it is assumed that the matching segment circuit to which an RF is applied in FIG. 1A is provided as the first matching unit, and the matching segment circuit to which an RF is applied in FIG. 1B is provided as the second matching unit, the first matching unit may include a first input end 721, a first parallel segment, a second inductor, and a first output end 725, and the second matching unit may include a second input end 723, a second parallel segment, a third capacitor, and a second output end 727. The third output end 713 of the first integrated device 710 may be connected to the first input end 721 and the second input end 723 of the matching segment 720 in series.

In this instance, a first capacitor and a first inductor configuring the first parallel segment, a second inductor connected to the first parallel segment in series, a second capacitor and a third inductor configuring the second parallel segment, and a third capacitor connected to the second parallel segment in series may be determined so that an impedance of the first integrated device 710 matches an impedance of a second RF device connected to the first output end 725 and the second output end 727.

Referring to FIG. 7B, the RF integrated device 700 may include a matching segment 730 and a first integrated device 740.

Any of the various example matching segment circuits to which an RF is applied in FIG. 1A through FIG. 5C may be used as the matching segment 730. For example, the matching segment circuit to which an RF is applied in FIG. 5B may be used as a component of the matching segment 730. Thus, the matching segment 730 may include a first matching unit and a second matching unit. In an example in which it is assumed that the matching segment circuit of FIG. 1A, to which an RF is applied, is then provided as the first matching unit, and the matching segment circuit of FIG. 1B, to which an RF is applied, is also provided as the second matching unit, the first matching unit may include a first input end, a first parallel segment, a second inductor, and a first output end 733, and the second matching unit may include a second input end, a second parallel segment, a third capacitor, and a second output end 735. The first input end and the second input end may be connected to a fourth input end 731.

The first integrated device 740 may include a third output end 743 and a third input end 741 respectively configured as a dual port. The first integrated device 740 may also correspond to a balance filter.

The first output end 733 and the second output end 735 of the matching segment 730 may be connected to the third input end 741. In this instance, a first capacitor and a first inductor configuring the first parallel segment, a second inductor connected to the first parallel segment in series, a second capacitor and a third inductor configuring the second parallel segment, and a third capacitor connected to the second parallel segment in series may be determined so that an impedance of the first integrated device 740 matches an impedance of a fifth RF device connected to the fourth input end 731.

Figure 8A:
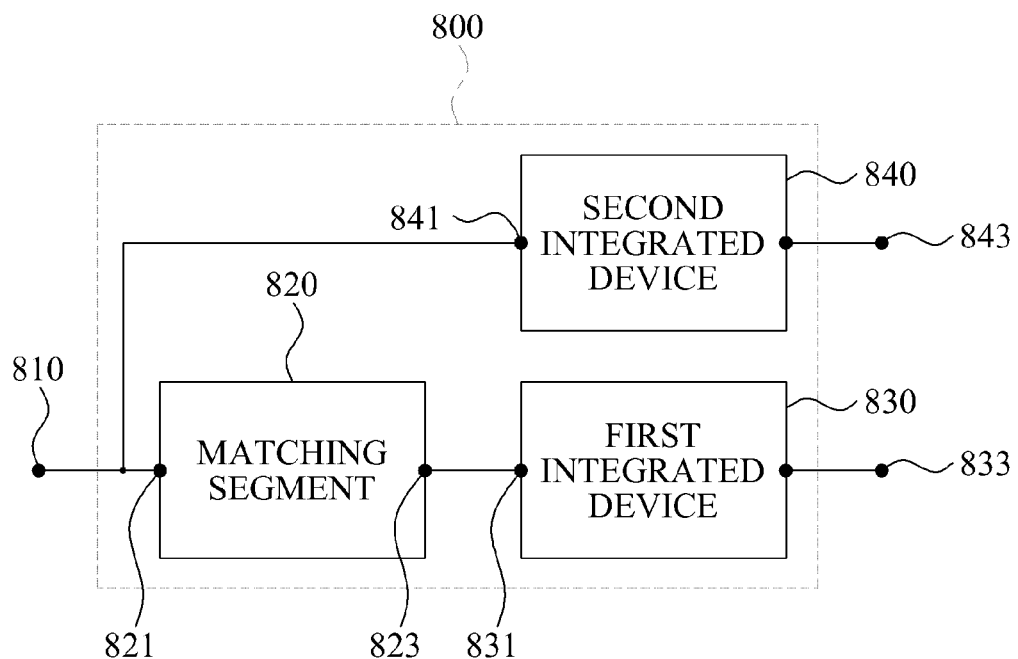
Figure 8B:
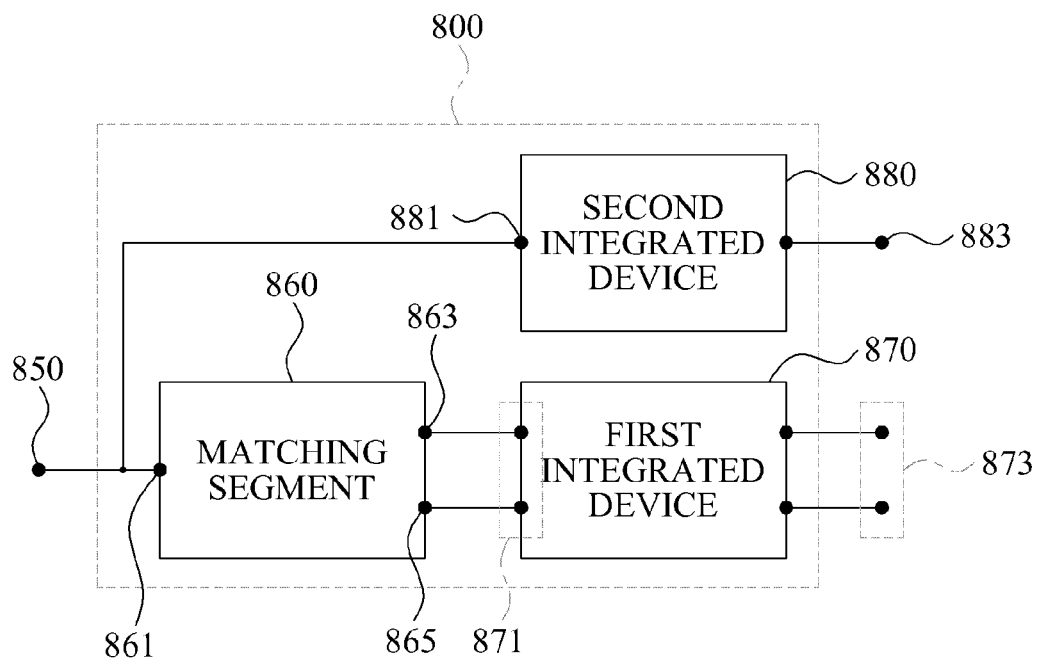

FIGS. 8A and 8B illustrate examples in which an RF integrated device corresponds to an RF duplexer.

In more detail, FIGS. 8A and 8B illustrate examples in which an RF integrated device corresponds to an RF duplexer 800 using a BAWR. FIG. 8A illustrates a duplexer including a single ended type matching segment, a first integrated device having an output end and an input end configured as a single port, and a second integrated device having an output end and an input end configured as a single port. FIG. 8B illustrates a duplexer including a balun type matching segment, a first integrated device having an output end and an input end configured as a dual port, and a second integrated device having an output end and an input end configured as a single port.

Referring to FIG. 8A, the RF duplexer 800 may include an antenna end 810, a matching segment 820, a first integrated device 830, and a second integrated device 840.

The antenna end 810 may receive a signal from an external source to transfer the signal to a receiving filter, and may transmit the transferred signal through a transmitting filter to the outside.

Any of the various example matching segment circuits to which an RF is applied in FIG. 1A through FIG. 5C may be used as the matching segment 820. For example, the matching segment circuit of FIG. 1A to which an RF is applied may be used as a component of the matching segment 820. Thus, the matching segment 820 may include a first input end 821, a parallel segment, a second inductor, and a first output end 823.

The first integrated device 830 may include a second output end 833 and a second input end 831 respectively configured as a single port. In this instance, the first integrated device 830 may correspond to a receiving filter as a BPF using a BAWR. The first integrated device 830 may filter a signal received from an external source through an antenna end 810 in a predetermined frequency band. The second input end 831 of the first integrated device 830 and the first output end 823 of the matching segment 820 may be connected to each other in series. The first integrated device 830 may correspond to a transmitting filter.

The second integrated device 840 may include a third output end 843 and a third input end 841 configured by a single port. In this instance, the second integrated device 840 may correspond to a transmitting filter as a BPF using a BAWR. The second integrated device 840 may filter a received signal in a predetermined frequency band to transmit the signal to the outside through the antenna end 810. The first input end 821 of the matching segment 820 and the third input end 841 of the second integrated device 840 may be connected to the antenna end 810. The second integrated device 840 may correspond to a receiving filter.

In this example, a first capacitor and a first inductor provided in the parallel segment, and a second inductor connected to the parallel segment in series may be determined so that the first integrated device 830 and the antenna end 810 may be matched at a predetermined impedance, the second integrated device 840 and the antenna end 810 may be matched at a predetermined impedance, the first integrated device 830 and the second integrated device 840 may be matched at a predetermined impedance, and a phase difference between a signal passing through the first integrated device 830 and a signal passing through the second integrated device 840 may be 180 degrees out of phase.

Referring to FIG. 8B, the RF duplexer 800 may include an antenna end 850, a matching segment 860, a first integrated device 870, and a second integrated device 880.

The antenna end 850 may receive a signal from an external source to transfer the signal to a receiving filter, and transmit the transferred signal through a transmitting filter to the outside.

Any of the various example matching segment circuits to which an RF is applied in FIG. 1A through FIG. 5C may be used as the matching segment 860. For example, the matching segment circuit to which an RF is applied in FIG. 5B may be used as a component of the matching segment 860. Thus, the matching segment 860 may include a first matching unit and a second matching unit. In an example in which it is assumed that the matching segment circuit of FIG. 1A to which an RF is applied, is then provided as the first matching unit, and the matching segment circuit of FIG. 1B to which an RF is applied, is provided as the second matching unit, the first matching unit may include a first input unit, a first parallel segment, a second inductor, and a first output end 863, and the second matching unit may include a second input unit, a second parallel segment, a third capacitor, and a second output end 865. The first input end and the second input end of the respective first and second matching units may be connected to a fourth input end 861.

The first integrated device 870 may include a third output end 873 and a third input end 871 respectively configured as a dual port. The first integrated device 870 may correspond, for example, to a balance filter. In this example, the first integrated device 870 may correspond to a receiving filter as a BPF using a BAWR. The first integrated device 870 may filter a signal received from an external source through an antenna end 850 in a predetermined frequency band. The third input end 871 of the first integrated device 870 may be connected in series to the first output end 863 and the second output end 865 of the matching segment 860. The first integrated device 870 may correspond to a transmitting filter.

The second integrated device 880 may include a fourth output end 883 and a fourth input end 881 respectively configured as a single port. In this example, the second integrated device 880 may correspond to a transmitting filter as a BPF using a BAWR. The second integrated device 880 may filter a received signal in a predetermined frequency band to transmit the signal to the outside through the antenna end 850. The fourth input end 861 of the matching segment 860 and the fourth input end 881 of the second integrated device 880 may be connected to the antenna end 850. The second integrated device 880 may correspond to a receiving filter.

In this instance, a first capacitor and a first inductor configuring the first parallel segment, a second inductor connected to the first parallel segment in series, a second capacitor and a third inductor configuring the second parallel segment, a third capacitor connected to the second parallel segment in series may be determined so that the first integrated device 870 and the antenna end 850 may match at a predetermined impedance, the second integrated device 880 and the antenna end 850 may match at a predetermined impedance, the first integrated device 870 and the second integrated device 880 may match at a predetermined impedance, and a phase difference between a signal passing through the first integrated device 870 and a signal passing through the second integrated device 880 may be 180 degrees out of phase.

The matching segment circuit to which an RF is applied according to various examples may be implemented, for example, on a silicon substrate, a printed circuit board (PCB) substrate, a low temperature co-fired ceramic (LTCC)

substrate, and the like. The matching segment circuit to which an RF is applied may be integrated with a device such as, for example, an RF filter, an RF duplexer, or any combination thereof to be an integrated passive device in a module form.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A matching segment circuit to which a radio frequency (RF) is applied, the circuit comprising:
    a first matching unit;
    a second matching unit; and
    a first integrated device, connected to the first matching unit and the second matching unit, using a acoustic wave resonator (BAWR) including a first input end and a first output,
    wherein the first matching unit includes
        a second input end connected to the first output end of the first integrated device,
        a first segment, connected to the second input end, having at least one of capacitors and at least one of inductors, and
        a second output end connected to the first segment,
    wherein the second matching unit includes
        a third input end connected to the first output end of the first integrated device,
        a second segment, connected to the third input end, having at least one of capacitors and at least one of inductors, and
        a third output end connected to the second segment, and
    wherein the first segment and the second segment are configured so that an impedance of the first integrated device matches an impedance of at least one external RF device connected to the first matching unit and the second matching unit.

2. The circuit of claim 1, wherein the first segment comprising:
    a parallel segment connected to the second input end, and comprising a first capacitor and a first inductor connected in parallel; and
    a second inductor connected to the parallel segment in series,
    wherein the second output end is connected to the second inductor.

3. The circuit of claim 1, wherein the first segment comprising:
    a parallel segment connected to the second input end, and comprising a first capacitor and a first inductor connected in parallel; and
    a second capacitor connected to the parallel segment in series,
    wherein the second output end is connected to the second capacitor.

4. The circuit of claim 1, wherein the first segment comprising:
    a first capacitor connected to the second input end and a ground; and
    a first inductor connected to the first capacitor,
    wherein the second output end is connected to the first inductor.

5. The circuit of claim 1, wherein the first segment comprising:
    a first inductor connected to the second input end and a ground; and
    a first capacitor connected to the first inductor,
    wherein the second output end is connected to the first capacitor.

6. The circuit of claim 1, wherein the first segment comprising:
    a first capacitor connected to the second input end and a ground;
    a first inductor connected to the second input end; and
    a second capacitor connected to the first inductor and a ground,
    wherein the second output end is connected to both of the first inductor and second capacitor.

7. The circuit of claim 1, wherein the first segment comprising:
    a first capacitor connected to the second input end;
    a first inductor connected to the first capacitor and a ground; and
    a second capacitor connected to both of the first inductor and the first capacitor,
    wherein the second output end is connected to the second capacitor.

8. The circuit of claim 1, wherein the first segment comprising:
    a first inductor connected to the second input end;
    a first capacitor connected to the first inductor and a ground; and
    a second inductor connected to both of the first capacitor and the first capacitor,
    wherein the second output end is connected to the second inductor.

9. The circuit of claim 1, wherein the first segment comprising:
    a first inductor connected to the second input end and a ground;
    a first capacitor connected to the second input end; and
    a second inductor connected to the first capacitor and a ground,
    wherein the second output end is connected to both of the first inductor and second capacitor.

10. The circuit of claim 1, wherein the second segment comprising:
    a parallel segment connected to the third input end, and comprising a first capacitor and a first inductor connected in parallel; and
    a second inductor connected to the parallel segment in series,
    wherein the third output end is connected to the second inductor.

11. The circuit of claim 1, wherein the second segment comprising:
    a parallel segment connected to the third input end, and comprising a first capacitor and a first inductor connected in parallel; and
    a second capacitor connected to the parallel segment in series,
    wherein the third output end is connected to the second capacitor.

12. The circuit of claim 1, wherein the second segment comprising:
    a first capacitor connected to the third input end and a ground; and
    a first inductor connected to the first capacitor, wherein the third output end is connected to the first inductor.

13. The circuit of claim 1, wherein the second segment comprising:
   a first inductor connected to the third input end and a ground; and
   a first capacitor connected to the first inductor,
   wherein the third output end is connected to the first capacitor.

14. The circuit of claim 1, wherein the second segment comprising:
   a first capacitor connected to the third input end and a ground;
   a first inductor connected to the third input end; and
   a second capacitor connected to the first inductor and a ground,
   wherein the third output end is connected to both of the first inductor and second capacitor.

15. The circuit of claim 1, wherein the second segment comprising:
   a first capacitor connected to the third input end;
   a first inductor connected to the first capacitor and a ground; and
   a second capacitor connected to both of the first inductor and the first capacitor,
   wherein the third output end is connected to the second capacitor.

16. The circuit of claim 1, wherein the second segment comprising:
   a first inductor connected to the third input end;
   a first capacitor connected to the first inductor and a ground; and
   a second inductor connected to both of the first capacitor and the first capacitor,
   wherein the third output end is connected to the second inductor.

17. The circuit of claim 1, wherein the second segment comprising:
   a first inductor connected to the third input end and a ground;
   a first capacitor connected to the third input end; and
   a second inductor connected to the first capacitor and a ground,
   wherein the third output end is connected to both of the first inductor and second capacitor.

* * * * *